United States Patent
Ma

(10) Patent No.: US 6,749,441 B1
(45) Date of Patent: Jun. 15, 2004

(54) ELECTRICAL CONNECTOR WITH PROTECTIVE COVER

(75) Inventor: Hao-Yun Ma, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/635,634

(22) Filed: Aug. 5, 2003

(30) Foreign Application Priority Data

Mar. 21, 2003 (TW) ..................................... 92204445 U

(51) Int. Cl.[7] ............................................... H01R 11/22
(52) U.S. Cl. ...................... 439/66; 439/591; 439/259
(58) Field of Search ........................ 439/66, 70, 71, 439/342, 259, 591, 331

(56) References Cited

U.S. PATENT DOCUMENTS

| | | | |
|---|---|---|---|
| 4,750,890 A | * | 6/1988 | Dube et al. .................... 439/70 |
| 4,865,554 A | * | 9/1989 | Matsuoka et al. ............. 439/70 |
| 5,013,256 A | * | 5/1991 | Matsuoka et al. ........... 439/264 |
| 5,161,983 A | * | 11/1992 | Ohno et al. .................... 439/71 |
| 5,387,121 A | * | 2/1995 | Kurz .......................... 439/342 |
| 6,016,254 A | * | 1/2000 | Pfaff ............................. 439/71 |
| 6,027,345 A | | 2/2000 | McHugh et al. |
| 6,146,151 A | | 11/2000 | Li |
| 6,146,152 A | | 11/2000 | McHugh et al. |
| 6,164,978 A | | 12/2000 | McHugh et al. |
| 6,350,138 B1 | * | 6/2001 | Atobe ........................ 439/266 |
| 6,293,806 B1 | | 9/2001 | Yu |

* cited by examiner

Primary Examiner—P. Austin Bradley
Assistant Examiner—Briggitte R. Hammond
(74) Attorney, Agent, or Firm—Wei Te Chung

(57) ABSTRACT

An electrical connector includes an insulative housing (10) defining a first surface (100) and a second surface (101), a plurality of contacts (11) received in the housing, a cover (13) slidably mounted on the housing and a spring (12) positioned between the housing and the cover. The housing defines a plurality of restricting slots (1050) having a first protruding portion (1051) and a second protruding portion (1052). The cover defines a plurality of openings (1301) and a plurality of hooks (131) cooperating with the corresponding restricting slot of the housing. When the cover is at a first position where the hooks cooperate with the first protruding portions, the contact is between the upper surface of the cover and the first surface of the housing, when the cover is at a second position where the hooks cooperate with second protruding portion, the contact is beyond the openings of the cover.

13 Claims, 4 Drawing Sheets

US 6,749,441 B1

ELECTRICAL CONNECTOR WITH PROTECTIVE COVER

BACKGROUND OF THE INVENTION

1. Field of the Invention

The present invention relates to an electrical connector used for electrically connecting a land grid array (LGA) integrated circuit (IC) module to a printed circuit board (PCB).

2. Description of the Related Art

An electrical connector used for electrically connecting an LGA electrical component to a PCB is widely applied in the field of electronics, and a correlative article is found in *Nonlinear Analysis Helps Design LGA Connectors* (Connector Specifier, February 2001). Such connectors disclosed in U.S. Pat. Nos. 6,027,345, 6,146,151, 6146,152, 6,164,978 and 6,293,806 comprise insulative housings and contacts received in the housings.

A typical such electrical connector 6 shown in FIG. 6 used for electrically connecting an LGA IC module to a PCB comprises a insulative housing 60 defining a plurality of passageways 600 for receiving a plurality of contacts 61. In addition, the housing 60 defines a mating surface 601 for supporting the IC module. In order to obtain excellent elasticity for ensuring reliable electrical connection between the IC module 7 and the contact 61, the contact must define a long elastic arm and the contacting portion 610 of the contact 61 must be beyond the mating surface 601. While the electrical connector is put into use, the IC module 7 presses on the contacting portion 610 to make the contact 61 transform elastically. However, because the contacting portion 610 is beyond the mating surface 600, the contacting portion 610 will be bended or damaged by factors such as rough handling or accidental impact, which will weaken, even destroy, the electrical connection between the IC module 7 and the connector 6.

Hence, a new electrical connector is desired to overcome the above-described disadvantages.

SUMMARY OF THE INVENTION

An object of the present invention is to provide an electrical connector which has a protective cover to protect a plurality of contacts received in the connector.

In order to achieve the aforementioned object, an electrical connector in accordance with a preferred embodiment of the present invention comprises an insulative housing defining a first surface and a second surface, a plurality of contacts received in the housing, a cover slidably mounted on the housing and a spring positioned between the housing and the cover. The housing defines two opposite sidewalls vertically connecting the first surface and the second surface, each sidewall defining two restricting slots respectively. The cover defining a plurality of openings comprises a plurality of hooks cooperating with the corresponding restricting slot of the housing. When the cover is at a first position in which the hooks cooperate with the first protruding portions, the contact is positioned between the upper surface of the cover and the first surface of the housing, when the cover is at a second position which the hooks cooperate with second protruding portions, the contact is beyond the openings of the cover.

Other objects, advantages and novel features of the present invention will become more apparent from the following detailed description when taken in conjunction with the accompanying drawings, in which:

DESCRIPTION OF THE PREFERRED EMBODIMENT

Figure 1:
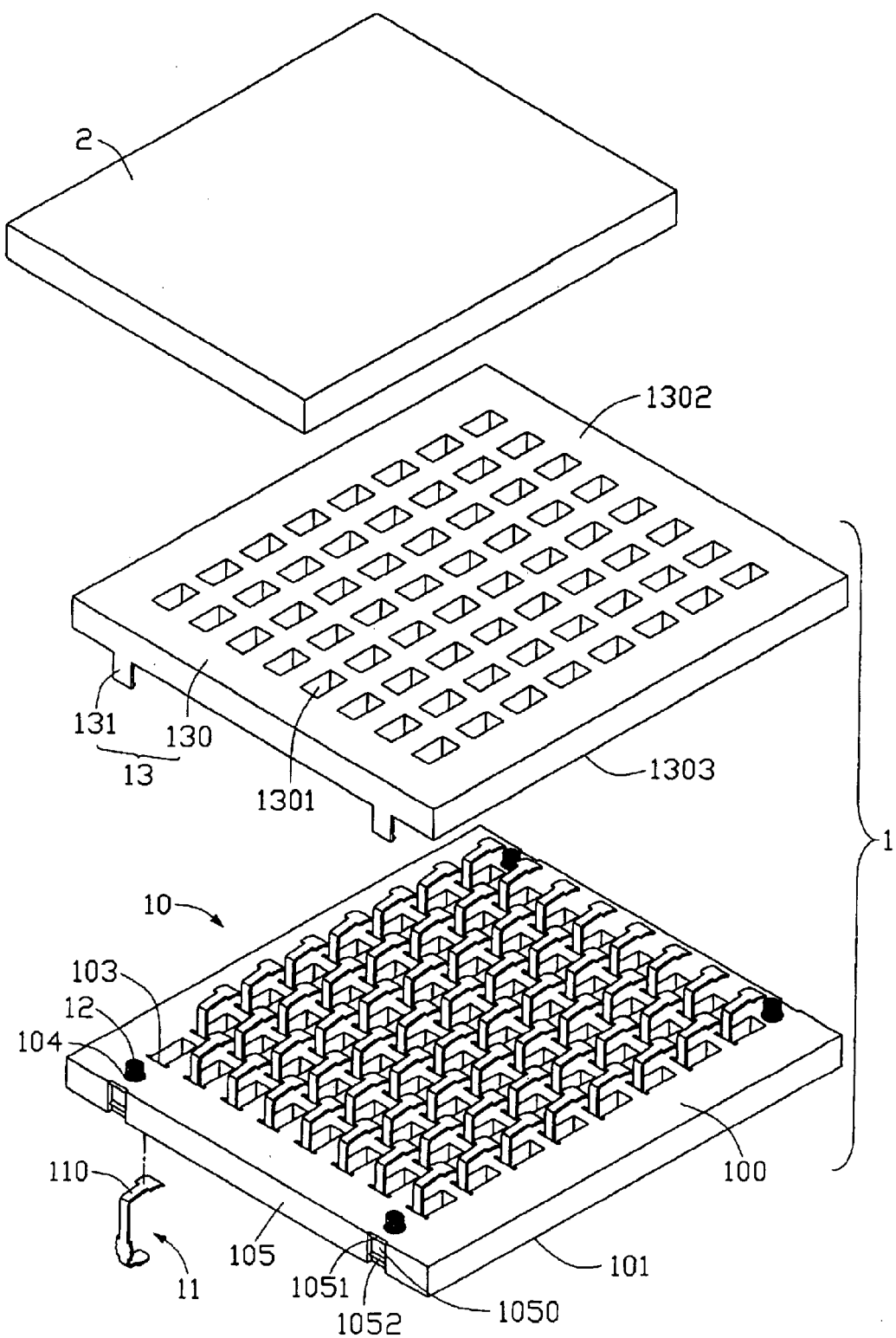
FIG. 1 is an exploded, isometric view of an electrical connector in accordance with the preferred embodiment of the present invention, shown with an IC module to be mounted on the connector.

Reference will now be made to the drawing figures to describe the present invention in detail.

Figure 2:
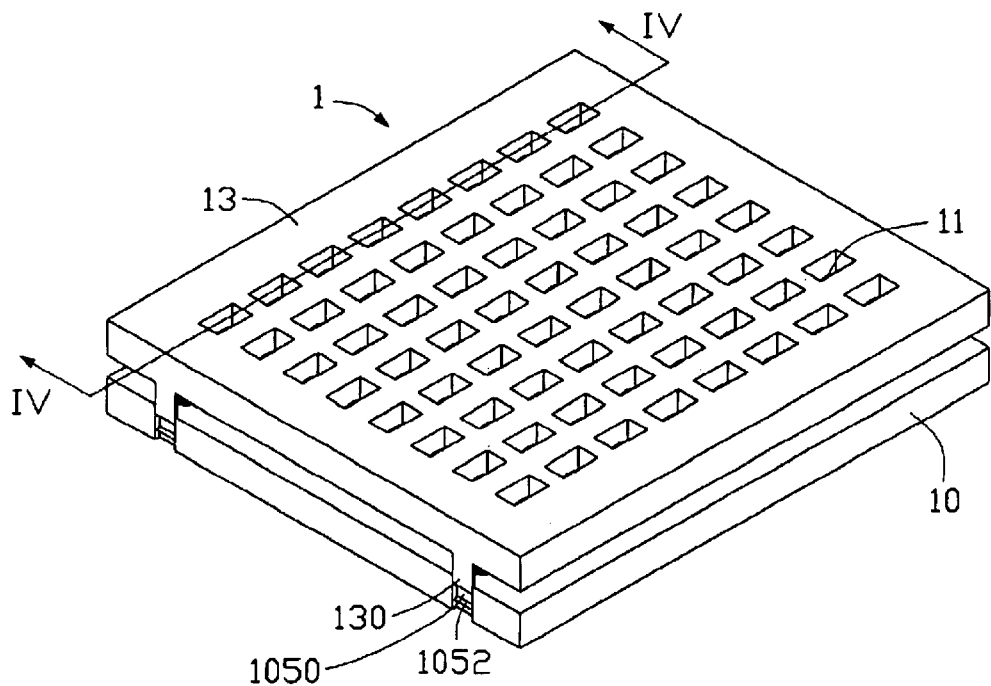
FIG. 2 is an isometric view of the electrical connector.
Figure 3:
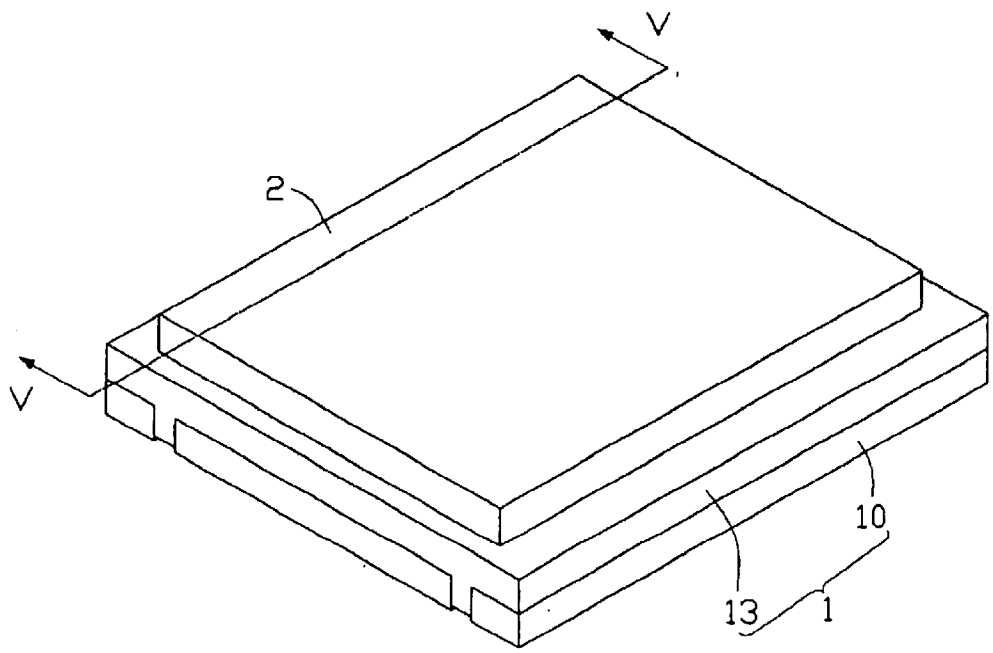
FIG. 3 is an assembled view of FIG. 1.
Figure 4:
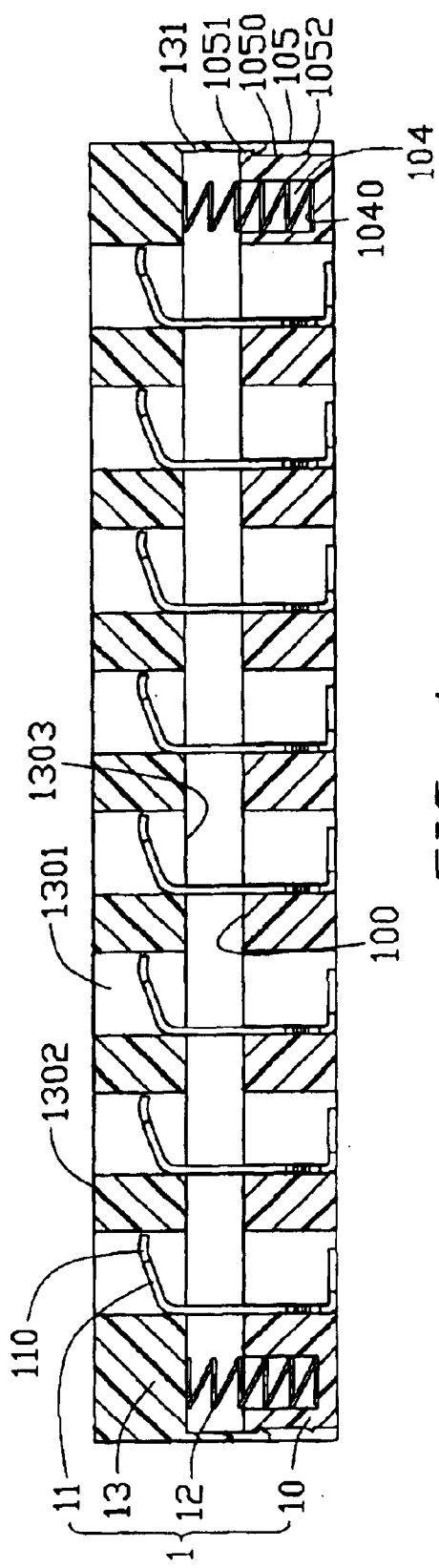
FIG. 4 is a cross-sectional view taken along line IV—IV of FIG. 2.
Figure 5:
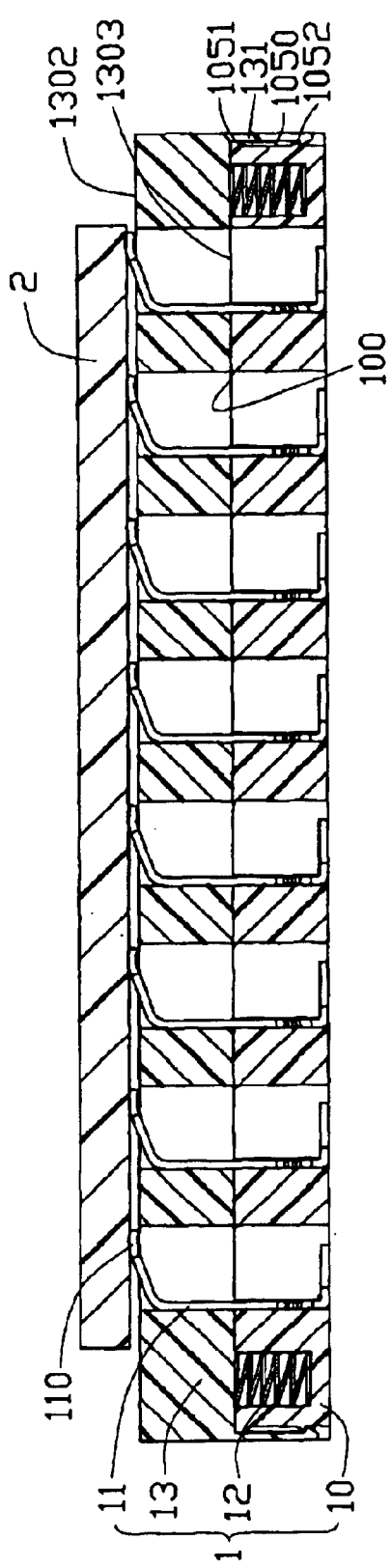
FIG. 5 is a cross-sectional view taken along line V—V of FIG. 3.
Figure 6:
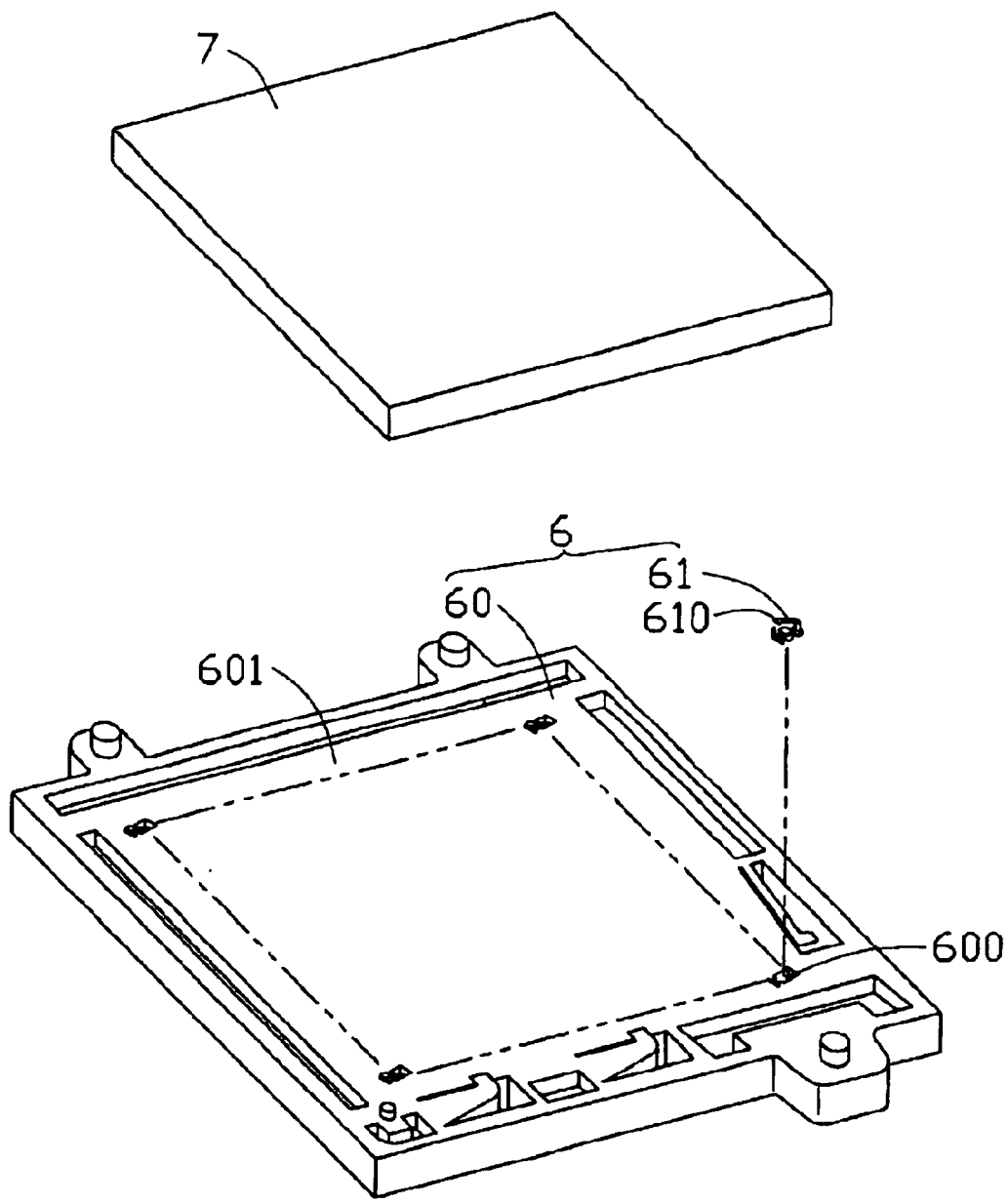
FIG. 6 is an isometric view of a conventional electrical connector, shown with a IC module to be mounted on the connector.

Referring to FIGS. 1–5, an electrical connector 1 of the present invention is used for electrically connecting an LGA IC module 2 to a PCB (not shown). The connector 1 comprises an insulative housing 10, a plurality of contacts 11 received in the housing 10, a cover 13 slidably mounted on the housing 10, and a plurality of elastic members positioned in the housing 10. In the preferred embodiment of the present invention, each elastic member is a spring 12.

The housing 10 defines a first surface 100 mating with the cover 13, a second surface 101 mating with the PCB, and a plurality of passageways 103 spanning between the first surface 100 and the second surface 101. The housing 10 also defines two opposite sidewalls 105 vertically connecting the first surface 100 and the second surface 101. Each sidewall 105 defines two restricting slots 1050 therein. Each restricting slot 1050 has a first protruding portion 1051 adjacent the first surface 100, and a second protruding portion 1052 adjacent the second surface 101. The housing 10 defines four blind holes 104 in four corners of the first surface 100 respectively. Each blind hole 104 terminates at a respective supporting face 1040 of the housing 10. Each spring 12 is positioned in a corresponding blind hole 104, with one end of the spring 12 being restricted by the supporting face 1040, and an opposite end of the spring 12 being pressed on by the cover 13 (see FIG. 4).

The cover 13 comprises a supporting body 130, and a pair of hooks 131 depending from each of opposite sides of the supporting body 130. The hooks 131 correspond to the restricting slots 1050 of the housing 10. The supporting body 130 defines an upper surface 1302 supporting the IC module 2, and a lower surface 1303 opposite from the upper surface 1302. The cover 13 defines a plurality of openings 1301 corresponding to the passageways 103 of the housing 10, with the openings 1301 spanning between the upper surface 1302 and the lower surface 1303. The cover 13 is supported by the springs 12 received in the housing 10. By means of cooperation between the hooks 131 and the first protruding portions 1051, the cover 13 is compressibly attached on the housing 10.

Each contact 11 comprises a contacting portion 110, and is installed into a corresponding passageway 103 from the second surface 101 of the housing 10. When the cover 13 is suspended on the housing 10 at a first position in which the hooks 131 are engaged with the first protruding portions 1051, the contacting portion 110 protrudes beyond the first surface 100 and partially into a corresponding opening 1301.

When the cover 13 is at the first position, a distance between each first protruding portion 1051 and its corresponding second protruding portion 1052 is equal to a distance between the first surface 100 of the housing 10 and the lower surface 1303 of the cover 13. When the cover 13 is pressed to a second position in which the hooks 131 are engaged with the second protruding portions 1052, the contacting portion 110 of each contact 11 protrudes beyond the upper surface 1302.

When the electrical connector 1 is put into use, the IC module 2 is positioned on the upper surface 1302 of the cover 13 and pushed toward the housing 10 in a vertical direction. Thus the springs 12 are compressed, and the cover 13 is actuated to move toward the housing 10. As a result, the hooks 131 move from respective first positions to respective second positions.

The contacts 11 move in the corresponding openings 1301 toward the upper surface 1302. When the first surface 100 reaches the lower surface 1303, the cover 13 is in the second position. The hooks 131 engage with the second protruding portions 1052, and the contacting portions 110 of the contacts 11 protrude from the upper surface 1302 and electrically connect with corresponding conductive portions of the IC module 2.

When the electrical connector 1 is not in use, the cover 13 is in the first position. The contacts 11 are partially received in the openings 1301 of the cover 13 without protruding thereout. Thus the contacts 11 are protected from accidental damage caused by factors such as rough handling or accidental impact.

While the present invention has been described with reference to a specific embodiment, the description is illustrative of the invention and is not to be construed as limiting the invention. Various modifications can be made to the preferred embodiment by those skilled in the art without departing from the true spirit and scope of the invention as defined by the appended claims.

What is claimed is:

1. An electrical connector used for electrically connecting an integrated circuit to a printed circuit board comprising:
   an insulative housing defining a first surface, a second surface and a plurality of passageways spanning the first and second surfaces;
   a cover defining an upper surface carrying the integrated circuit, a lower surface toward the first surface of the housing, and a plurality of openings corresponding to the passageways of the housing;
   at least one spring received between the housing and the cover, an end of the spring engaged with the housing and another end of the spring suppressed by the cover;
   a plurality of contacts received in the passageways of the housing; wherein
   the cover is supported by the spring and movably mounted on the housing, which enables the cover to slide on the housing along a direction perpendicular to the first and second surfaces wherein the housing defines a plurality restricting slots, each restricting slot having a first protruding portion and a second protruding portion at the sidewalls thereof, the cover defines a plurality of openings thereon and forms a plurality of hooks corresponding to the restricting slots.

2. The electrical connector as described in claim 1, wherein the housing defines a plurality of blind holes on a peripheral portion of the housing, each blind hole extending from the first surface toward the second surface and terminating at a supporting face therein.

3. The electrical connector as described in claim 1, wherein a distance between the first protruding portion and the second protruding is substantially equal to a distance between the first surface of the housing and the lower surface of the cover when the hooks cooperate with the first protruding portions.

4. An electrical connector used for electrically connecting an integrated circuit to a printed circuit board comprising:
   an insulative housing defining a first surface, a second surface and a plurality of passageways spanning the first and second surfaces;
   a cover slidably mounted on the housing and defining an upper surface for carrying the integrated circuit and a lower surface toward the first surface of the housing, the cover defining a plurality of openings corresponding to the passageways of the housing;
   at least one spring upwardly urging the cover away from the housing;
   a plurality of contacts received in the passageways of the housing, each contact defining a contacting portion positioned between the upper surface of the cover and the first surface of the housing, and partially received in a corresponding opening; wherein,
   when the cover is pressed downward, the contacting portions of the contacts protrude from the openings of the cover to connect with the integrated circuit.

5. The electrical connector as described in claim 1, wherein the housing defines a plurality of blind holes on a peripheral portion of the housing, each blind hole extending from the first surface toward the second surface and terminating at a supporting face therein.

6. The electrical connector as described in claim 1, wherein said openings are laterally segregated from one another.

7. The electrical connector as described in claim 1, wherein said contacts are in a relaxed manner when the contacting portions are located between the upper surface of the cover and the first surface of the housing.

8. The electrical connector as described in claim 1, wherein the housing defines a plurality of restricting slots at opposite sidewalls thereof, each restricting slot having a first protruding portion and a second protruding portion.

9. The electrical connector as described in claim 8, wherein the cover forms a plurality of hooks corresponding to the restricting slots.

10. The electrical connector as described in claim 9, wherein a distance between the first protruding portion and the second protruding is substantially equal to a distance between the first surface of the housing and the lower surface of the cover when the hooks engage with the first protruding portions.

11. An electrical connector used for electrically connecting an integrated circuit to a printed circuit board comprising:
    an insulative housing defining a first surface, a second surface and a plurality of passageways spanning the first and second surfaces, the housing defining a plurality restricting slots, each restricting slot having a first protruding portion and a second protruding portion;
    a cover slidably mounted on the housing defining an upper surface supporting the integrated circuit, a lower surface toward the first surface of the housing, and a plurality of openings corresponding to the passageways of the housing, the cover defining a plurality of hooks corresponding to the restricting slots of the housing;
    at least one spring received between the housing and the cover, an end of the spring engaged with the housing and another end of the spring suppressed by the cover;

a plurality of contacts received in the passageways of the housing, each contact defining a contacting portion; wherein, when the cover is at a first position in which the hooks cooperate with the first protruding portions, the contacting portion is positioned between the upper surface of the cover and the first surface of the housing, when the cover is at a second position in which the hooks cooperate with second protruding portions, the contacting portion is beyond the openings of the cover.

12. The electrical connector as described in claim 11, wherein the housing defines a plurality of blind holes on a peripheral portion of the housing, each blind hole extending from the first surface toward the second surface and terminating at a supporting face therein.

13. The electrical connector as described in claim 12, wherein a distance between the first protruding portion and the second protruding is substantially equal to a distance between the first surface of the housing and the lower surface of the cover when the hooks cooperate with the first protruding portions.

* * * * *